(12) United States Patent
Armitage et al.

(10) Patent No.: US 10,261,524 B2
(45) Date of Patent: Apr. 16, 2019

(54) MONITORING SYSTEM AND METHOD (71) Applicant: Newson Gale Limited, Nottingham (GB)

(72) Inventors: Andrew Armitage, Nottingham (GB); Michael O'Brien, Nottingham (GB)

(73) Assignee: NEWSON GALE LIMITED, Nottingham (GB)

( * ) Notice: Subject to any disclaimer, the term of this patent is extended or adjusted under 35 U.S.C. 154(b) by 638 days.

(21) Appl. No.: 14/906,645

(22) PCT Filed: Aug. 12, 2014

(86) PCT No.: PCT/GB2014/052461
§ 371 (c)(1),
(2) Date: Jan. 21, 2016

(87) PCT Pub. No.: WO2015/022517
PCT Pub. Date: Feb. 19, 2015

(65) Prior Publication Data
US 2016/0154410 A1 Jun. 2, 2016

(30) Foreign Application Priority Data
Aug. 16, 2013 (GB) .................................. 1314675.8

(51) Int. Cl.
G05D 9/12 (2006.01)
B60P 3/22 (2006.01)
(Continued)

(52) U.S. Cl.
CPC .............. *G05D 9/12* (2013.01); *B60P 3/2275* (2013.01); *B65D 90/46* (2013.01); *B67D 7/3236* (2013.01);
(Continued)

(58) Field of Classification Search
CPC ... B65D 2213/02; B65D 90/46; B60P 3/2275; B67D 7/3236; Y10T 137/8242;
(Continued)

(56) References Cited

U.S. PATENT DOCUMENTS 4,901,195 A * 2/1990 Stemporzewski, Jr. ..................... B67D 7/3236
340/649
5,534,856 A 7/1996 Cadman
(Continued)

FOREIGN PATENT DOCUMENTS

DE 3210932 10/1983
DE 4116066 11/1992
(Continued)

OTHER PUBLICATIONS

PCT International Search Report, International Filing Date Aug. 1, 2014.
European Search Report, International Filing Date Mar. 12, 2018.

Primary Examiner — Atif H Chaudry
(74) Attorney, Agent, or Firm — Dewitt LLP; Thomas J. Nikolai (57) ABSTRACT The disclosure relates to monitoring systems and methods. A first aspect relates to a monitoring system for use when loading fluid from a source tank to a destination tank via a loader apparatus, the monitoring system having: a first input for coupling to the source tank in order to receive a source tank input signal; a second input for coupling to the destination tank in order to receive a destination tank input signal; a sensor input for receiving a sensor signal from a fill level sensor in the destination tank; circuitry configured to determine: a first status of an electrical continuity between the loader apparatus and the source tank in accordance with the source tank input signal, a second status of an electrical continuity between the loader apparatus and the destination
(Continued)

tank in accordance with the destination tank input signal, and a fill level status in accordance with the sensor signal; and a single user interface for displaying the first status, second status and fill level status.

20 Claims, 4 Drawing Sheets

(51) Int. Cl.
    *B65D 90/46*     (2006.01)
    *B67D 7/32*     (2010.01)
    *B67D 7/34*     (2010.01)
    *B67D 7/36*     (2010.01)
    *G01F 23/26*     (2006.01)
    *G01R 31/02*     (2006.01)

(52) U.S. Cl.
    CPC .............. *B67D 7/34* (2013.01); *B67D 7/344* (2013.01); *B67D 7/362* (2013.01); *G01F 23/26* (2013.01); *G01R 31/026* (2013.01); *B65D 2213/02* (2013.01); *Y10T 137/6855* (2015.04); *Y10T 137/6866* (2015.04); *Y10T 137/8175* (2015.04); *Y10T 137/8242* (2015.04); *Y10T 137/8342* (2015.04); *Y10T 137/86187* (2015.04); *Y10T 137/86196* (2015.04)

(58) Field of Classification Search
    CPC ....... Y10T 137/86187; Y10T 137/8342; Y10T 137/8175; Y10T 137/86196; Y10T 137/6855; Y10T 137/6866; G05D 9/12; G01R 31/026; H05F 3/02; G01F 23/26
    See application file for complete search history.

(56) References Cited

U.S. PATENT DOCUMENTS

| | | | |
|---|---|---|---|
| 6,945,288 B1* | 9/2005 | Brakefield | B67D 7/04 |
| | | | 141/231 |
| 2006/0215345 A1 | 9/2006 | Yang | |
| 2006/0215436 A1 | 9/2006 | Jeung et al. | |
| 2008/0202624 A1 | 8/2008 | Hajiaghajani | |
| 2009/0045925 A1 | 2/2009 | Demin et al. | |
| 2010/0089486 A1* | 4/2010 | Koeninger | B67D 7/3209 |
| | | | 141/2 |
| 2014/0285928 A1* | 9/2014 | Andujar | G01R 31/025 |
| | | | 361/42 |

FOREIGN PATENT DOCUMENTS

| | | |
|---|---|---|
| DE | 4119677 | 12/1992 |
| GB | 2390692 | 1/2004 |
| GB | 2369447 | 6/2004 |
| GB | 2449285 | 11/2008 |
| GB | 2449285 | 8/2010 |
| WO | 20100083193 | 7/2010 |

\* cited by examiner

MONITORING SYSTEM AND METHOD

CROSS-REFERENCED TO RELATED APPLICATIONS

This application claims priority from Application PCT/GB2014/052461, filed Aug. 12, 2014, which is deemed incorporated by reference in its entirety in this application.

STATEMENT REGARDING FEDERALLY SPONSORED RESEARCH OR DEVELOPMENT

Not applicable.

BACKGROUND OF THE INVENTION

I. Field of the Invention

The present disclosure relates to a monitoring system for use in transferring fluid to or from a tank using a loader apparatus, such as a transloader. In particular, the disclosure relates to a monitoring system for use when loading fluid from a source tank to a destination tank via a transloader and to a monitoring system for use when loading fluid to or from a rail tanker via a transloader.

II. Discussion of the Prior Art

It has long been known that processes where fluid or powder flows to or from an apparatus can lead to a build-up of static charge. Unfortunately, there are many industrial applications where flowing material forms a readily combustible atmosphere that can be ignited by a spark from a discharge of built-up static. An explosion caused by such a discharge could lead to substantial damage to the apparatus and the surrounding area and may result in injuries or fatalities. It is therefore imperative for such industrial applications to ensure that the apparatus involved in fluid transfers is effectively grounded. Conventional protective systems have therefore been developed that include means for effectively connecting an electrically conductive item that is liable to accumulate static electricity, such as metal equipment or a storage container, to an earth reference potential in order to safely dissipate any static electricity build-up.

Conventional protective systems generally include an earth connection that connects the system to an earth of a mains electricity supply (line voltage), which is assumed to provide a high integrity earth connection. However, it is sometimes necessary for an electrical conductor, such as a vehicle, to be connected to an earth connection in a remote location where mains electricity is not supplied. In such situations, an electrical conductor may be connected to an earth rod, which is a metal rod that is driven into the earth, or existing metalwork connected to the earth, such as I-beams, pipework, or storage tanks. In such cases, there is a need to verify the integrity of the earth connection, and in particular to test whether the electrical conductor is reliably connected to earth reference potential by a resistance equal to or less than a predetermined value.

In recent years, the development of the shale oil industry has led to reliance on transloading in remote locations with limited electrical supply infrastructure or fluid transfer infrastructure, such as a loading tower. At such sites, fluid may be transferred from a series of trucks to a tank on a rail tank car via a transloader cart. Alternatively, the site may be provided with a loading tower for loading or unloading the rail tanker. However, such infrastructure may have been constructed rapidly or for a limited period and may not necessarily be grounded as expected by a user of the site. Due to the rapid development of the shale industry, there is an as yet unmet need for integrated and easy to use systems that ensure the safe transfer of fluid in such loading situations.

SUMMARY OF THE INVENTION

According to a first aspect of the invention there is provided a monitoring system for use when loading fluid from a source tank to a destination tank via a loader apparatus, the monitoring system having:
 a first input for coupling to the source tank in order to receive a source tank input signal;
 a second input for coupling to the destination tank in order to receive a destination tank input signal;
 a sensor input for receiving a sensor signal from a fill level sensor in the destination tank;
 circuitry configured to determine:
  a first status of an electrical continuity between the loader apparatus and the source tank in accordance with the source tank input signal,
  a second status of an electrical continuity between the loader apparatus and the destination tank in accordance with the destination tank input signal, and
  a fill level status in accordance with the sensor signal; and
 a single user interface for displaying the first status, second status and fill level status.

The monitoring system may comprise a single housing. The circuitry may be disposed within the single housing. The single user interface may be disposed on the single housing.

The monitoring system may comprise a source tank electrical connector. The first input may be configured to be coupled to the source tank via the source tank electrical connector. The monitoring system may comprise a destination tank electrical connector. The second input may be configured to be coupled to the destination tank via the destination tank electrical connector. The monitoring system may comprise a loader electrical connector configured to be coupled to the loader apparatus.

The circuitry may be configured to determine the first status in accordance with a resistivity of an electrical loop comprising the source tank electrical connector and the loader electrical connector. The circuitry may be configured to determine the second status in accordance with a resistivity of an electrical loop comprising the destination tank electrical connector and the loader electrical connector.

The monitoring system may comprise a track electrical connector for coupling to a rail track. The circuitry may be configured to determine the second status in accordance with a resistivity of an electrical loop comprising the destination tank electrical connector, the loader electrical connector and track electrical connector.

The circuitry may be configured to determine a capacitance status in accordance with a capacitance between the track electrical connector and the source tank. The capacitance status may be indicative of the rail track being a true ground. The capacitance status may be indicative of the electrical conductivity between the source tank and the loader apparatus. The circuitry may be configured to determine the first status and/or the second status in response to the capacitance status.

The circuitry configured to determine the first status may have a first terminal and a second terminal. The circuitry configured to determine the second status may have a third terminal and a fourth terminal. The first status may be an alert if the resistance between the first and second terminals is greater than a predetermined threshold. The second status may be an alert if the resistance between the third and fourth terminals is greater than a predetermined threshold. The predetermined threshold may be 10 ohms.

The monitoring system may comprise a fill level sensor for providing in the destination tank. The fill level sensor may comprise a capacitive sensor.

The monitoring system may comprise a source sensor input for receiving a source sensor signal from a fill level sensor in the source tank. The circuitry may be configured to determine a source fill level status in accordance with the source sensor signal.

According to a second aspect of the invention there is provided a monitoring system for use when loading fluid to or from a rail tanker via a loader apparatus, the monitoring system having:
    a track electrical connector for coupling to a rail track;
    a tank electrical connector for coupling to a tank on a rail car;
    a loader electrical connector for coupling to the loader apparatus; and
    circuitry configured to determine:
        a status of an electrical continuity between the tank on the rail car, the rail track and the loader.

The monitoring system may comprise a single user interface for displaying the, or each, status.

The monitoring system may comprise a single housing. The circuitry may be disposed within the single housing. The single user interface may be disposed on the single housing.

The monitoring system may comprise a second tank electrical connector for coupling to a second tank. The circuitry may be configured to determine a status of electrical continuity between the second tank and the loader apparatus. The monitoring system may comprise a fluid conduit electrical connector for coupling to a fluid conduit, such as at a distal end of the fluid conduit from the loader apparatus. The fluid conduit may be a loading arm of the loader apparatus. The circuitry may be configured to determine a status of an electrical continuity between the fluid conduit and the loader apparatus.

The monitoring system may comprise a sensor input for receiving a sensor signal from a fill level sensor in the tank. The circuitry may be configured to determine a fill level status in accordance with the sensor signal. The monitoring system may comprise the fill level sensor for providing in the tank. The fill level sensor may comprise a capacitive sensor.

The loader apparatus may comprise a flow control device. The monitoring system may be configured to control the flow control device in accordance with one or more of the statuses determined by the circuitry.

According to another aspect of the invention there is provided a loader apparatus comprising the monitoring system of any preceding claim.

According to another aspect of the invention there is provided a method for monitoring the loading of fluid from a source tank to a destination tank via a loader apparatus using a monitoring system having a source tank electrical connector, a destination tank electrical connector, a loader electrical connector for coupling to the loader apparatus and a sensor input, the method comprising:
    coupling the source tank electrical connector to the source tank;
    coupling the destination tank electrical connector to the destination tank;
    receiving a sensor signal from a fill level sensor in the destination tank at the sensor input; and
    controlling the loading operation in accordance with a status of an electrical continuity between the loader apparatus and the source tank, a status of an electrical continuity between the loader apparatus and the destination tank and a fill level status derived from the sensor signal.

According to another aspect of the invention there is provided a method for monitoring the loading of fluid to or from a tank on a rail car via a loader apparatus using a monitoring system having a track electrical connector, a tank electrical connector and a loader electrical connector for coupling to the loader apparatus, the method comprising:
    coupling the track electrical connector to a rail track;
    coupling the tank electrical connector to the tank on the rail car; and
    controlling the loading operation in accordance with a status of an electrical continuity between the tank on the rail track, the loader apparatus and the rail track.

According to a further aspect of the invention there is provided a loader apparatus for loading of fluid to or from a tank, comprising:
    a base;
    a fluid conduit mounted on the base for engaging with the tank, the fluid conduit having a proximal end and a distal end with respect to the base; and
    a monitoring system comprising circuitry configured to determine a status of an electrical continuity between the distal end of the fluid conduit and the base.

The tank may be mounted on a rail car. The monitoring system may comprise a fluid conduit electrical connector coupled to the distal end of the fluid conduit. The monitoring system may comprise a track electrical connector for coupling to a rail track. The monitoring system may comprise a tank electrical connector for coupling to the tank on the rail car. The monitoring system may comprise a loader electrical connector for coupling to the loader apparatus. The circuitry may be configured to determine a status of an electrical continuity between the tank on the rail car, the rail track and the base of the loader apparatus. The monitoring system may comprise a sensor input for receiving a sensor signal from a fill level sensor in the destination tank. The monitoring system may comprise circuitry configured to determine a fill level status in accordance with the sensor signal. The loader apparatus of claim may comprise a single user interface for displaying the determined statuses.

According to a further aspect of the invention there is provided a method of monitoring the loading of fluid to or from a tank using the loader apparatus described above, the method comprising:
    determine a status of an electrical continuity between the proximal end and the distal end of the fluid conduit; and
    in accordance with the status, engaging the distal end of the fluid conduit with the tank.

The determination of the status may be performed when the fluid conduit is disengaged from the tank. The distal end of the fluid conduit may be engaged with the tank if a resistance of the electrical continuity is less than or equal to a threshold level. The distal end of the fluid conduit may remain separate from the tank if a resistance of the electrical continuity is greater than or equal to the threshold level. The threshold level may be 10 ohms.

Except where the context disallows it, it will be appreciated that features described with regard to one aspect or embodiment of the invention may be provided in combination with features described with regard to another aspect or embodiment.

DESCRIPTION OF THE DRAWINGS

Embodiments of the present invention will now be described by way of example and with reference to the accompanying drawings in which:

FIG. 1b represents a schematic representation of example connections for a monitoring system such as that in FIG. 1a;

FIG. 3 illustrates a schematic representation of a monitoring circuit such as that of FIG. 1a.

DESCRIPTION OF THE PREFERRED EMBODIMENT

Embodiments of the invention relate to an integrated monitoring system that can enable an operator to control a fluid loading process in accordance with the status of electrical connections between the monitoring system and apparatus involved in the loading process, as well as in accordance with the status of a fluid level in the apparatus. The term fluid is used herein to include any material that flows and so includes powders. The controlling of the loading operation may be performed automatically by the monitoring system or by the operator in response to information displayed on a user interface of the monitoring system. The provision of an integrated monitoring system in which the status indication or interlocking operations from a number of different sub-systems are combined improves the safety of the loading operation and ease of use of the system whilst reducing the complexity of the system.

Figure 1A:
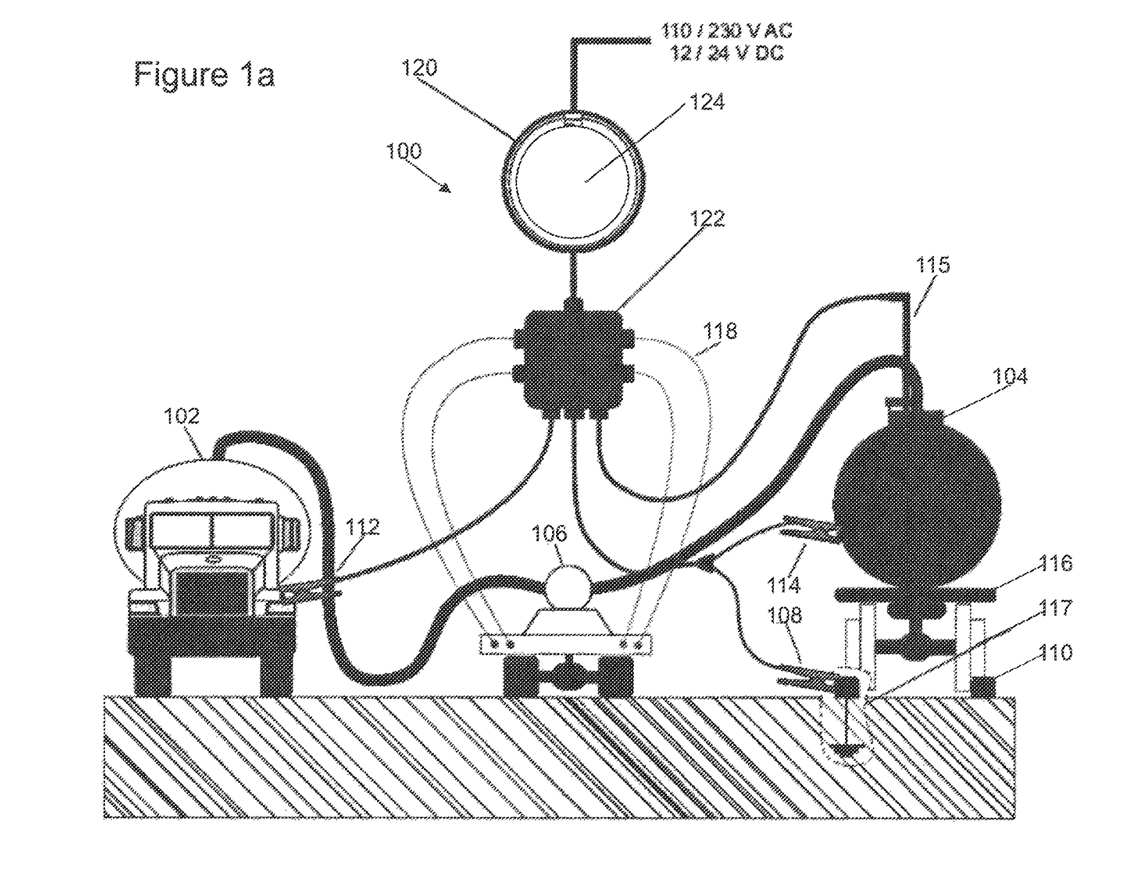
FIG. 1a illustrates a schematic representation of a monitoring system on a transloader connecting a source tank to a destination tank.

FIG. 1a shows a schematic representation of a monitoring system 100 for use when loading fluid from a source tank 102 to a destination tank 104 via a loader apparatus 106. In this example, the source tank 102 is disposed on a truck, or road tanker, the destination tank 104 is disposed on a rail car, or cart, situated on rail tracks 110 and the loader apparatus 106 is a transloader. The transloader comprises a mobile cart with a pump for conveying fluid from the source tank 102 to the destination tank 104. The wheels of the transloader generally insulate the body of the transloader from earth. Such an arrangement of apparatus is typically used for oil extraction in remote locations where oil from a well head may be shipped to a rail head by a series of road tankers and then transferred on to a tanker train for delivery to a refinery. In alternative configurations, the source tank 102 may be disposed on a rail cart and/or the destination tank 104 may be disposed on a truck, for example.

During the loading operation, it is important to ensure that the source tank 102, destination tank 104 and transloader 106 are held at a common potential in order to prevent a potential difference between these apparatus from accumulating due to static build up. The monitoring system 100 comprises a number of electrical connectors 108, 112, 114 for coupling to the various pieces of apparatus (that is, the source tank 102, destination tank 104 and loader apparatus 106) in order to electrically couple the various apparatus to the monitoring system 100. The monitoring system 100 comprises circuitry that can be used to determine a status for an electrical conductivity between each of the pieces of apparatus. This status information can be used to drive a display and operate an interlock for the transloader pump.

A fill level sensor 115 is provided in the destination tank 104. The circuitry of the monitoring system 100 also comprises a sensor input for receiving a signal from the fill level sensor. The sensor input enables the monitoring system 100 to reduce the likelihood of overfill of, or spillage from, the destination tank 104. This is particularly important in petrochemical applications where spillage is likely to result in environmental damage and the release of potentially hazardous chemicals.

The fill level sensor 115 in this example is housed in a cane probe which may be provided separately from, or as part of, the monitoring system 100. The fill level sensor 115 may be an optical sensor, a capacitive sensor or a thermistor, and provides an output when the destination tank 104 has been loaded to a required level. However, it has been found that the use of a capacitive sensor as a fill level sensor provides a sensor that is reliable over a wide range of viscosities compared to the other categories of sensor. Inductive sensors may also be used to detect the presence of metallic objects with a tank.

A source fill level sensor may also be provided in the source tank 102. The monitoring system 100 may also comprise a sensor input for receiving a signal from the source fill level sensor and circuitry configured to determine a source fill level status in accordance with the source sensor signal. In this case, the monitoring system 100 may be configured to determine when a quantity of fluid has been transferred to the destination tank, or that the source tank has been emptied, in accordance with a sensor signal from the source fill level sensor.

Typically, the monitoring system 100 is integrated with the transloader 106 and so the monitoring system 100 and the transloader 106 are electrically connected. Any means for electrically connecting the monitoring system 100 to the transloader 106 can be considered to provide a loader electrical connector. In the example shown, bonding wires loops are provided as a loader electrical connector 118 between the monitoring system 100 and the transloader 106. Alternatively, the mounting of the monitoring system 100 may electrically couple the transloader 106 to the monitoring system 100. As a further alternative, a removable jaw or clamp electrical connector can be used to connect the monitoring system 100 to the transloader. Suitable jaw or clamp electrical connectors for use herein are described in Newson Gale Limited's granted UK patents GB 2,369,447 and GB 2,449,285, for example. The properties of such clamps are discussed further with regard to FIG. 1b, below.

The electrical connectors also include a source tank electrical connector 112 for coupling to the source tank 102 and a destination tank electrical connector 114 for coupling to the destination tank 104. These electrical connectors 112, 114 are typically removable devices such as jaw or clamp electrical connectors. The terms "source" tank electrical connector 112 and "destination" tank electrical connector 114 are merely labels to aid the clarity of the following description and do not necessarily impart any particular limitations on the type of electrical connector that can be used or to which of the apparatus 102, 104, 106 they are connected. Preferably, the resistance of the various connections provided by the electrical connectors 112, 114 should be less than or equal to 10 ohms so that the source tank 102, destination tank 104 and transloader 106 can be held at a common potential and so prevent a potential difference between the apparatus from accumulating.

The wheels of the transloader 106 and road tanker insulate the body of the transloader and the source tank 102 from the earth. It has been found that the tank 104 situated on the rail car is also not, in many cases, earthed to the rails 110 by the undercarriage 116 of the rail car. This lack of grounding may be attributed to the presence of insulating components in the suspension and/or transmission of the rail cart, such as wear pads, anti-vibration mountings and bearings. The electrical connectors therefore can include a track electrical connector 108 for coupling to a rail track 110 in order to verify that the tank 108 on the rail car is validly earthed thereby improving the safety of the process of loading or unloading the tank 104 on the rail car. The track electrical connector 108 may also provide the functionality of an additional earth connection and so ensure that all of the apparatus (the source and destination tanks 102, 104 and the transloader 106) are connected to the monitoring system. In such examples, the track electrical connector 108 may be used to prevent the build up of a high common potential between the apparatus and ground.

Rail tracks are typically earthed 117 by contact with ground at regular intervals along the track. The use of rail tracks as a grounding means therefore eliminates the need to install a grounding rod before commencing the transloading operation and so provides for a simpler monitoring system 100. However, in some cases, it may be desirable to provide a separate connection between the rails 110 and earth, which may be achieved using a grounding rod and clamp (not shown), for example. The grounding rod may be left in-situ between trans-loading sessions. The grounding rod may be provided as part of a kit comprising the monitoring system 100.

The monitoring system 100 in this example comprises a control and monitoring unit 120 and a clamp and sensor junction box 122. The control and monitoring unit 120 comprises static bonding and fill level detection circuitry. The clamp and sensor junction box 122 connects the circuitry to the electrical connectors 108, 112, 114 and the level detection sensor housed in the probe 115, respectively.

The control and monitoring unit 120 comprises a first and a second static bonding circuitry unit. The first static bonding circuitry unit determines a status of an electrical continuity of an electrical loop comprising the loader apparatus 106 and the source tank 102. The second static bonding circuitry determines a status of an electrical continuity of an electrical loop comprising the loader apparatus 106 and the destination tank 104 and, optionally, the rail track 110. An example of the electrical connections provided by the clamp and sensor junction box 122 is discussed further with reference to FIG. 1b.

Determining a status of the electrical continuity can include verifying that the electrical continuity is adequate to provide grounding. The electrical continuity is typically considered to be adequate to provide grounding when the resistance between the grounded item and the earth reference is less than 10 ohms. An example of the circuitry units provided in the monitoring unit 120 is also described further with reference to FIG. 3.

The control and monitoring unit 120 may also comprise circuitry including relays to control interlock and a flow control device, such as a fluid pump or valve, positioned on the transloader 106. In such examples the control and monitoring circuitry 120 allows the monitoring system 100 to automatically control the flow control device based on the statuses determined by the static bonding and level detection circuitry. That is, the control and monitoring circuitry can be configured to shut-off flow from the source tank 102 to the destination tank 104 in response to detecting that the electrical continuity between any of the apparatus is inadequate or that a fluid level in the destination tank 104 has been reached. The monitoring system 100 therefore provides integrated overfill protection and static protection sensing at least on the downstream side of the transloader 106 with at least static protection sensing on the upstream sides of the transloader 106.

In other examples, the control and monitoring unit 120 and clamp and sensor junction box 122 could be provided by a single housing. Where a single housing is provided, the circuitry of the monitoring system 100 is disposed within the single housing. The provision of a single housing reduces the complexity of the system by removing the need for conduits and wiring between a plurality of housings.

Figure 1B:
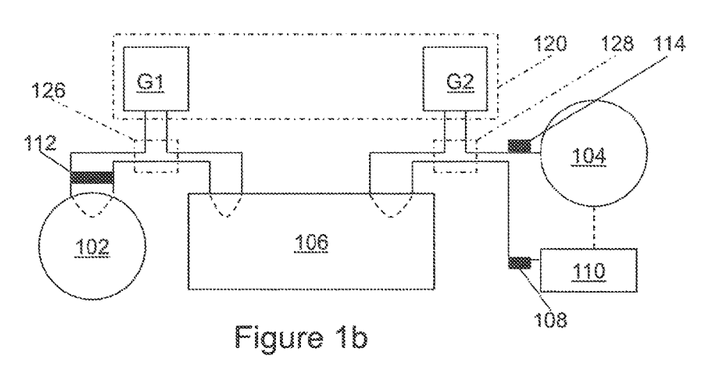

The monitoring system shown in FIGS. 1a and 1b can be considered to be suitable for certification as "intrinsically safe". This means that the system is unable to release sufficient energy, by either thermal or electrical means, into the potentially explosive surrounding atmosphere to cause ignition of flammable material (fluid or dust/particulates).

In this example, a single user interface 124 is provided on the sensor junction box 122 for displaying the statuses determined by the static bonding and level detection circuitry. The single user interface 124 can provide an operator with a consolidated view of the status of various safety systems and so makes it easier for the operator to check the security of the entire arrangement of apparatus. The provision of a single user interface 124 improves the intelligibility and accessibility to the operator of the information provided by the system compared to the situation where indicators of the various statuses are disposed in different locations and/or on different monitoring units. As such, the single user interface 124 can enable the operator to identify the source of a specific error in the system more easily by providing an indicator for the status of the connection with each apparatus 102, 106. Where a single housing is provided, the single user interface can be disposed on the single housing. The single user interface 124 could also be used to display other information, such as a fluid level status of the source tank 102.

FIG. 1b represents an example schematic representation of how the clamp and sensor junction box 122 can connect the monitoring system 100 to the apparatus 102, 104, 106 using a first junction box portion 126 and a second junction box portion 128.

A first input of the monitoring circuit 100 is provided by terminals of the first static bonding circuitry G1. The first static bonding circuitry G1 determines a status of an electrical continuity of an electrical loop comprising the loader apparatus 106 and the source tank 102. In this example, this is achieved by the first static bonding circuitry G1 performing a continuity test across its terminals. The terminals of the first static bonding circuitry G1 are coupled to the first junction box portion 126 by a main dual core (dual conductor) cable with a first line and a second line. The first junction box portion 126 splits the lines from the main dual core cable. The first line of the dual core cable is coupled to the source tank electrical connector 112 via a first line of a source dual core cable. A second line of the source dual core cable returns to the first junction box portion 126. The source tank electrical connector may be a clamp electrical connector that is configured to receive the source dual core cable.

A clamp electrical connector may comprises a pair of spring-loaded jaws, the tips of which are fitted with two mechanical point contacts on an underside of the first jaw and a single, central contact on an upper-side of a second jaw. The two contacts on the first jaw are separate and electrically conductive and configured to be coupled to the respective lines of the dual core cable. The contact on the second jaw comprises electrically insulating material and is of elongated form such that it is configured to engage with the upper contacts when the jaws are interlocked. The three-point mechanical contact arrangement ensures a stable and reliable application of the electrical connector, even when the electrical conductor of the item to which the connector is clamped is of an irregular shape. Applying the clamp electrical connector to a metal item completes a circuit between the two contacts on the first jaw.

The second line of the source dual core cable is coupled by the first junction box portion 126 to the loader apparatus 106 by a first line of a grounding loop. The body of the loader apparatus 106 electrically couples the first line of a grounding loop to a second line of the grounding loop, which returns to the first junction box portion 126. The second line of the grounding loop is coupled by the first junction box portion 126 to the second line of the main dual core cable. In this way, a complete electrical loop can be provided. The resistivity, or a related parameter, between the terminals of the first static bonding circuitry unit G1 provides a source tank input signal which enables the status of the electrical continuity of the electrical loop comprising the loader apparatus 106 and the source tank 102 to be determined. The related parameter may be a current or voltage that is proportional to the resistance. Alternatively, the input signal may be related to a capacitance between the terminals. Such a system is described below with reference to GB 2,449,285.

A second input of the monitoring circuit 100 is provided by terminals of the second static bonding circuitry G2. The second static bonding circuitry unit G2 determines a status of an electrical continuity of an electrical loop comprising the loader apparatus 106 and the destination tank 104 and the rail track 110. This determination may be achieved by the second static bonding circuitry unit G2 performing a continuity test across its terminals. The terminals of the second static bonding circuitry unit G2 are coupled to the second junction box portion 128 by a main dual core cable with a first line and a second line. The second junction box portion 128 splits the lines from the main dual core cable. The first line of the main dual core cable is coupled to the destination tank electrical connector 114 via a cable. In this example, neither the destination tank electrical connector 114 nor the track electrical connector 108 need be of any particular design and do not have to receive a dual core cable.

The second line of the main dual core cable is coupled by the second junction box portion 128 to the loader apparatus 106 by a first line of a grounding loop. The body of the loader apparatus 106 electrically couples the first line of a grounding loop to a second line of the grounding loop, which returns to the second junction box portion 128. The second line of the grounding loop is coupled by the second junction box portion 128 to the track electrical connector 108.

The track electrical connector 108 is coupled to the destination tank electrical connector 114 due to electrical conductivity between the tank 104 and the rail track 110. In this way, a complete electrical loop can be provided. The resistivity, or a related parameter, between the terminals of the second static bonding circuitry unit G2 provides a destination tank input signal which enables the status of the electrical continuity of the electrical loop comprising the loader apparatus 106, the destination tank 104 and the rail track 110 to be determined.

Where a track electrical connector 108 is not provided, the electrical loop associated with the second static bonding circuitry unit G2 may be similar to that illustrated with reference to the first static bonding circuitry unit G1 (with the source tank electrical connector substituted for a destination tank electrical connector).

Capacitive circuitry for determining a capacitance status may be provided using an oscillator for generating an AC signal similar to that disclosed in GB 2,449,285. The capacitive circuitry enables the monitoring circuit to determine whether the rail track is a true earth connection.

The track electrical connector 108 is provided to attach the track 110 to the loader apparatus, which is coupled to an earth connection of the oscillator. The AC signal from the oscillator can be fed to the source tank 102 electrical connector 112 (the electrical connector that is attached to the tank on the road tanker) via a dual core cable. In effect the cable provides a delivery and return path for the signal. The capacitive circuitry may be tuned to a pre-determined series impedance of 1000 ohms or less. The source electrical connector 112 delivers the AC signal to the source tank 102, which has a capacitance relative to the earth that is within a pre-determined range of capacitances.

Attaching the impedance of the source tank 102 modifies the frequency of the generated AC signal compared to the signal generated when nothing is attached. Based on the change in frequency, it can be verified that the rail track 110 has an earth connection and that the tank 102 on the road tanker is connected to the transloader cart 106. The change in frequency of the signal can be used to determine properties of the conductive item. Once the rail 110 is verified as having an earth connection, circuitry that determines the resistivity between the apparatus and track may be used to ensure safe transloading. The device of GB 2,449,285 also comprises a means for determining whether the resistance between the earth connection and earth reference potential is less than a maximum earth resistance value by comparing the frequency of the generated AC signal with a pre-determined range of frequencies.

Variants of the monitoring system 100 can be used in a number of ways. For example, the monitoring system may be provided with a source tank electrical connector 112, a destination tank electrical connector 114, and a sensor input, but not necessarily with a track electrical connector 108. Typically, a loader electrical connector 118 is provided by the integration of the monitoring system and the loader apparatus. An operator of such a monitoring system may use it to monitor the loading of fluid from a source tank to a destination tank via a loader apparatus using a method comprising the steps of: coupling the source tank electrical connector 112 to the source tank 102; coupling the destination tank electrical connector 114 to the destination tank 104; receiving a sensor signal from a fill level sensor 115 in the destination tank 104 at the sensor input; and controlling the loading operation in accordance with an electrical continuity between the loader apparatus 106 and the source tank 102, an electrical continuity between the loader apparatus 106 and the destination tank 104, and a fill level status derived from the sensor signal. The controlling operation may be performed automatically by the monitoring system 100 or by the operator in response to information displayed on a user interface 124 of the monitoring system 100. If a rail track electrical connector 108 is provided, the operator may couple the rail track electrical connector 108 to a rail track 110 before controlling the loading operation.

Figure 2:
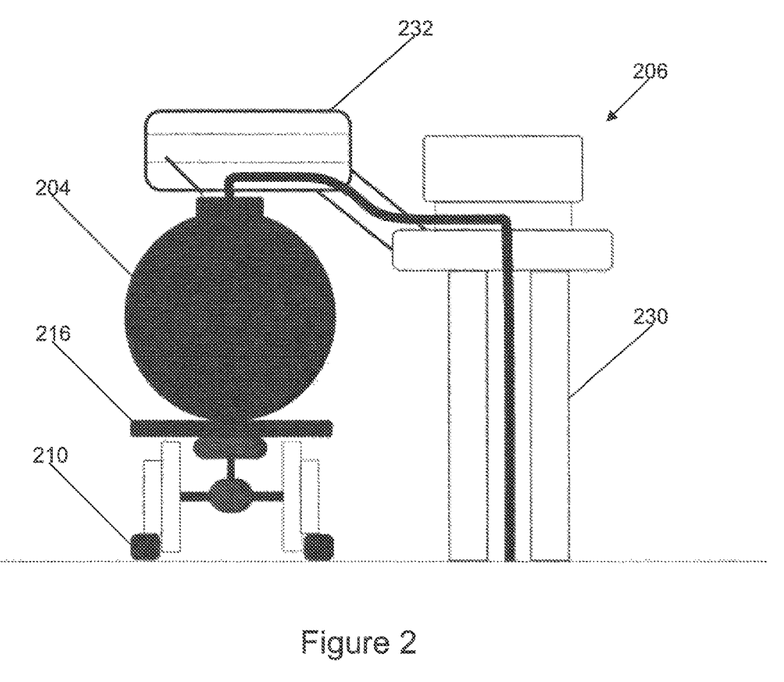
FIG. 2 illustrates a schematic representation of a rail tanker situated on rail tracks and connected to a loader apparatus where a monitoring system may be used to improve safety.

FIG. 2 shows a schematic representation of another situation in which a monitoring system similar to that of FIG. 1a may be used. Similar features between FIGS. 1 and 2 are provided with corresponding reference numerals in series 100 and 200, respectively.

In FIG. 2, a rail tanker is situated on rail tracks 210 and connected to a loader apparatus 206. The rail tanker comprises an undercarriage 216 and a tank 204 and the loader apparatus 206 comprises a loading tower 230 and overhead gantry 232. The loader apparatus 206 may be used to load fluid to or unload fluid from the tank 204.

In remote locations where loading sites have been constructed hastily or for a temporary duration, there may be uncertainty as to whether the loading tower 230 is adequately earthed. In cases where the tower 230 comprises an insulating material, only coupling the tank 204 to the tower 230 will alleviate the build up of a potential difference between the apparatus but will not result in the apparatus being earthed.

In order to provide a safe operating environment in such circumstances a monitoring system similar to that in FIG. 1a, but with only one of the source/destination tank electrical connectors and an optional sensor input and display may be used. That is, the monitoring system may comprise: a track electrical connector for coupling to a rail track 210; a tank electrical connector for coupling to the tank 204 on the rail car; a loader electrical connector for coupling to a loader apparatus 206; and circuitry configured to determine the status of an electrical continuity between the tank 204 on the rail car and the rail track and between the loader apparatus and the rail track. The second static bonding circuitry unit G2 described with reference to FIG. 1b is suitable for use with such a system, whereas the first static bonding circuitry G1 may not be required. The sensor input and display may be provided with such a monitoring system in order to obtain the benefits of such components as described with reference to FIG. 1a.

Typically, the loader electrical connector is provided by the integration of the monitoring system and the loader apparatus. An operator of the monitoring system described with reference to FIG. 2 may use it to monitor the loading of fluid to or from a tank on the rail car via the loader apparatus using a method comprising the steps of: coupling the track electrical connector to a rail track 210; coupling the tank electrical connector to the tank 204 on the rail car; and controlling the loading operation in accordance with an electrical continuity between the tank, rail track and loader apparatus. The controlling operation may be performed automatically by the monitoring system or by the operator in response to information displayed on a user interface of the monitoring system.

Figure 3:
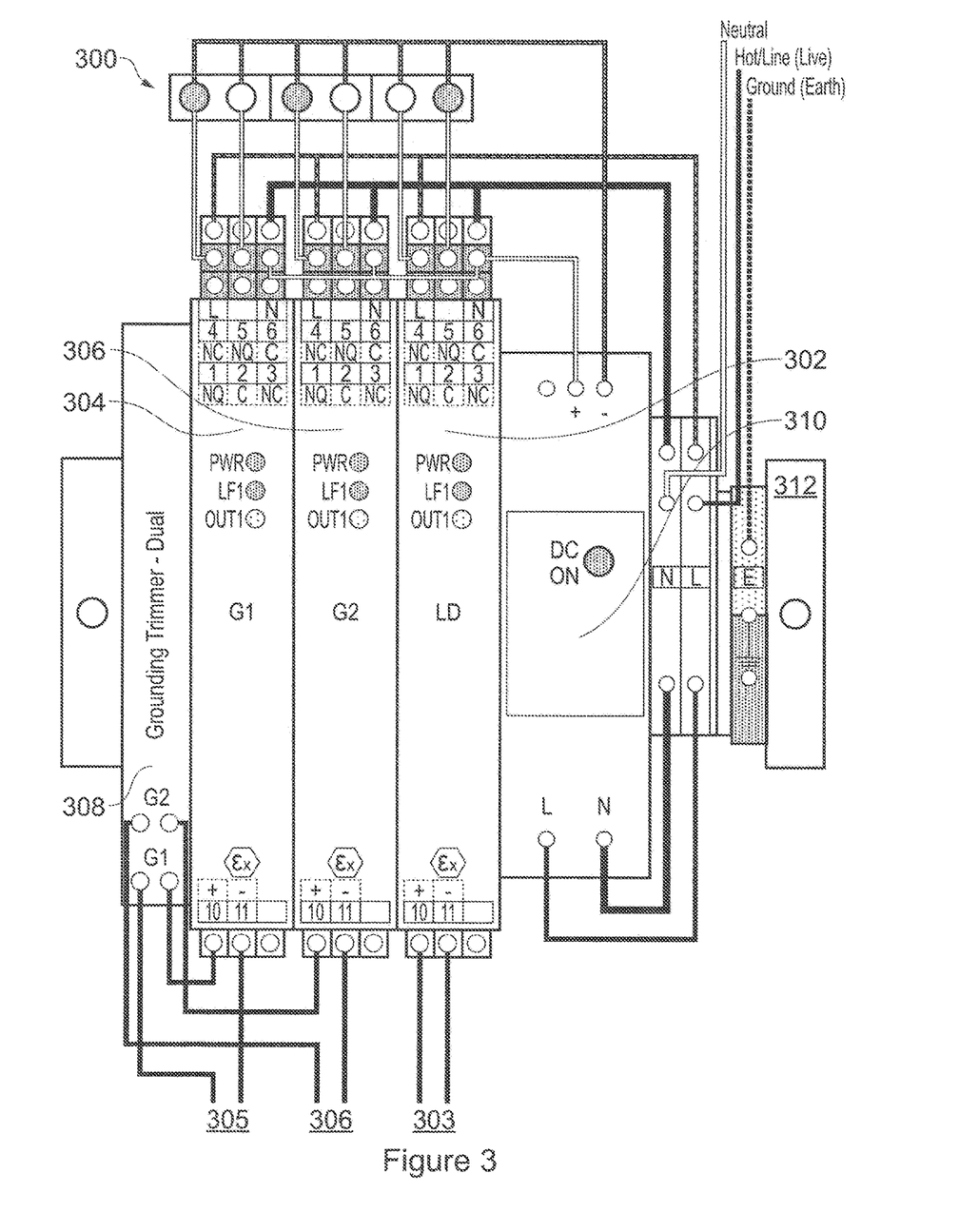

FIG. 3 illustrates a schematic representation of circuitry for a monitoring system 300. The monitoring system 300 provides a transloading operator with a status of grounding protection and fluid fill level for the duration of the transloading process. The monitoring system 300 comprises a level detection circuitry unit 302, a first static ground circuitry unit 304 and a second static ground circuitry unit 306. Each unit 302, 304, 306 provides an indicator, such as an LED, on a single user interface to show whether the unit has power and whether a status monitored by the respective circuit requires attention. In the example shown, a red LED indicates that a status is invalid (an alarm condition that requires the attention of the operator) and a green LED indicates that a status is valid (an acceptable or safe condition for fluid transfer). An audible alarm may also be provided in cases where a status requires attention.

The first and second static ground circuitry units 304, 306, which relate to those described earlier with reference to FIG. 1b, are each configured to determine whether a reliable connection has been made to apparatus to be grounded or to earth. The ground circuitry units 304, 306 are configured such that if the resistance between their terminals rises above 10 ohms the circuitry determines that the ground connection is invalid. In response, an intrinsically safe relay (incapable of providing the ignition source to ignite an atmosphere) switches so as to change the status shown by the indicators of the user interface. An interlock relay of the transloader equipment is also de-energised to halt pumping of fluid. The static ground circuitry units 304, 306 preferably provide Class 1, Division 1 (in accordance with: National Electrical Code, Articles 500, 505 and 506; the ATEX Equipment Directive and certified; and the IEC series of 60079 standards) intrinsically safe signals at their respective terminals 305, 306. The static ground circuitry units 304, 306 can employ an impedance measurement technique that determines whether an electrical connector has been attached to an item. An intrinsically safe relay unit or the monitoring unit disclosed in Newson Gale Limited's granted UK patents GB 2,369,447 or the circuitry in GB 2,449,285 may be used to provide each of the static ground circuitry units 304, 306.

GB 2,369,447 discloses a device for indicating whether an electrical connector has an electrical resistance equal to or less than a predetermined value or whether the electrical connector is reliably connected to earth reference potential by a resistance equal to or less than a predetermined value. The device comprises clamp means for connecting said device to the conductive element. The clamp means incorporates a battery powered monitoring unit comprising a current-to-voltage converter with a voltage output proportional to the resistance of the conductive element. The device also comprises a comparator which determines at predetermined intervals whether the voltage output is equal to or less than a pre-set reference, and hence whether the measured resistance is equal to or less than the predetermined value (in the range 1-100 Ohms). Signalling means are actuated to provide an indication as to whether the measured resistance is equal to or less than the predetermined value.

A contact resistance value of 10 ohms or less is recommended for contacts that dissipate electrostatic charge in IEC 60079-32-1 "Explosive atmospheres. Part 32-1: Electrostatic hazards, guidance", API RP 2003 "Protection Against Ignitions Arising out of Static, Lightning, and Stray Currents", British Standard 5958 (Control of Undesirable Static Electricity) and the subsequent standard CENELEC CLC/TR: 50404—Code of practice for the avoidance of hazards due to static electricity (2003) and NFPA 77 "Recommended Practice on Static Electricity", for example. One path of each of the dual core cables is routed via a grounding trimmer 308 which is a variable resistor provided in order to pull-in the resistance threshold for each grounding circuits from circa 3 kilo ohms to 10 ohms. The trimmer 308 may be set to work at 10 ohms or less using a decade resistance box during assembly of the monitoring system 300.

The level detection circuitry unit 302 is connected to the level sensor by the sensor input 303. If the level detection circuitry unit 302 detects a medium, such as oil, other than air within its field of operation it switches its indicator to show the change in status and de-energises a relay interlock with the transloader equipment.

The monitoring system 300 comprises a power supply unit (PSU) 310 for connecting to an AC supply, such as a mains electricity supply. The PSU 310 includes a transformer for stepping-down the voltage, and a voltage regulator for supplying a suitable DC voltage to the remainder of the circuit. The mains electricity supply is galvanically isolated from components that are external to the housing of the monitoring system 300 using isolating components, such as transformers and opto-isolators. The earth connection of the mains supply is coupled to a mounting board 312 which can be used to electrically and mechanically couple the monitoring system 300 to the transloader. The mounting board 312 may also be electrically coupled to earth connections of the level detection circuitry 302, the first static ground circuitry unit 304 and the second static ground circuitry unit 306.

Alternatively, the monitoring system 300 may be adapted to be connected to a DC power supply, such as a conventional 12V or 24V vehicle battery. In this case, the PSU may include a voltage regulator for supplying a suitable voltage to the remainder of the circuitry.

The components and materials of the monitoring system 300 may be selected so that reliable operation over a wide temperature range may be assured, such as between −50 to 50 degrees centigrade for example.

Figure 4:
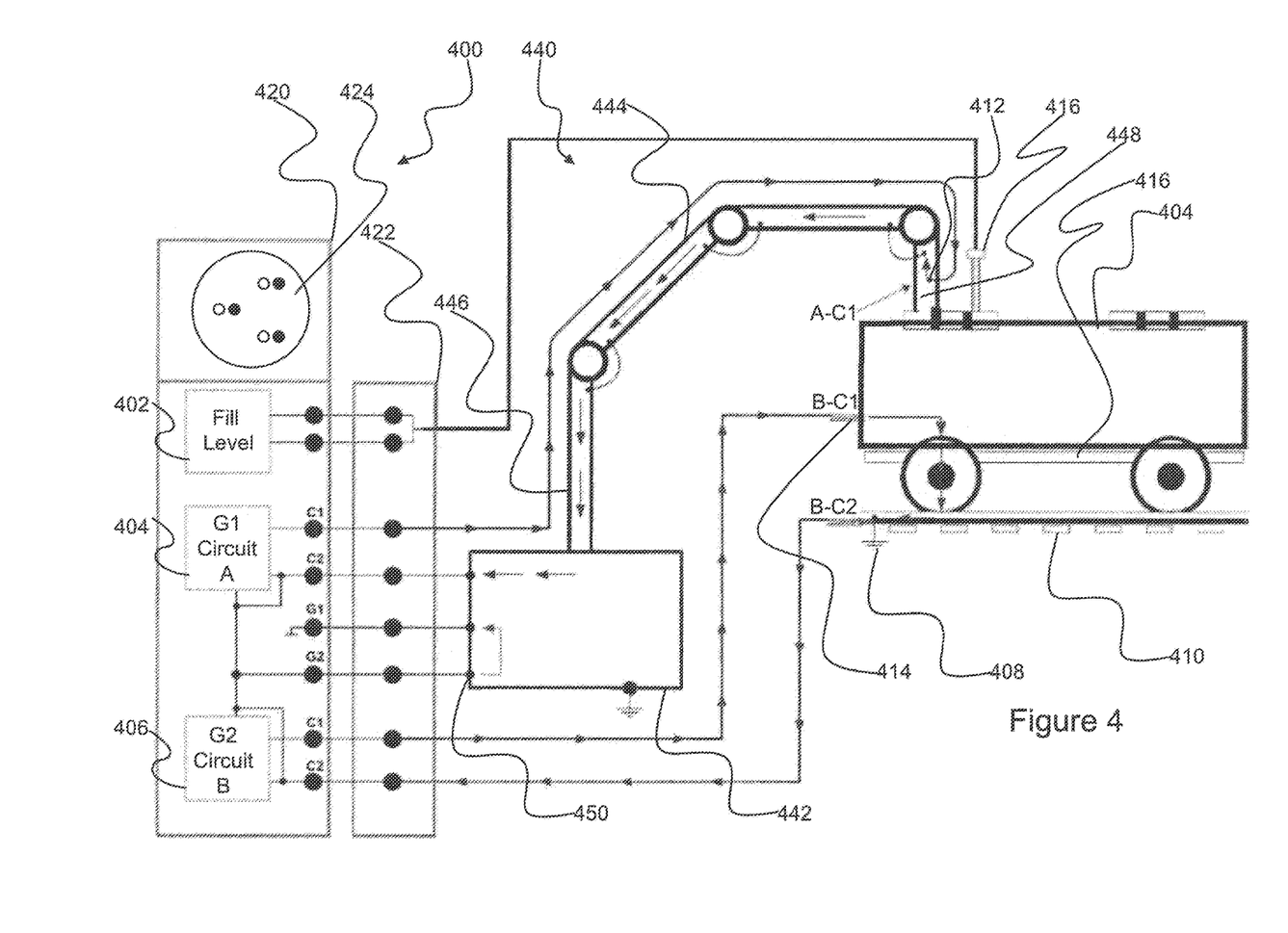
FIG. 4 illustrates a schematic representation of a rail tanker situated on rail tracks and connected to a loader apparatus where a monitoring system may be used to improve safety.

FIG. 4 illustrates another application of the monitoring system described with reference to FIG. 3. In this example, the monitoring system is provided with a loader apparatus 440 comprising a base 442, or rack superstructure, and a loading arm 444 that is mounted on the base 442. The loading arm 444 is shown positioned over, and engaged with, the tank 404, which in turn is mounted on a rail car 416 situated on rail tracks 410. The base 442 of the loader apparatus 440 is assumed to be grounded.

The loading arm 444 is a fluid conduit which may be used as a filling line, or for receiving fluid from the tank 404. The loading arm 444 has a proximal end 446 and a distal end 448 with respect to the base 442 of the loader apparatus 440. The loading arm is a modular structure comprising a number of sub-conduits, such as pipes and hoses. The modular arrangement can allow rotatable joints to be provided in the loading arm 444. Electrical isolation between the sub-conduits may be caused by plastic bearings or lubricating grease in swivel joints that connect the sub-conduits. In order to provide electrical continuity, each of the sub-conduits is electrically connected to its neighbouring conduits by a conductive strap.

Any electrical discontinuity along the loading arm 444 can allow static electricity to build-up due to the flow of fluid through the loading arm 444. The monitoring system 420 of FIG. 4 allows an operator to ensure that there is electrical continuity along a loading arm 444 of the loader apparatus 440 before commencing use of the loader apparatus 440. The monitoring system 400 in this example comprises a control and monitoring unit 420. The control and monitoring unit 420 comprises fill level monitoring circuitry 402, a first second static bonding circuitry unit G1 404, a second static bonding circuitry unit G2 406 and a clamp and sensor junction box 422. The clamp and sensor junction box 422 connects the circuitry 402, G1 404, G2 406 to various electrical connectors 408, 412, 414 and a level detection sensor housed in a probe, as described below.

The fluid conduit electrical connector 412 is provided for coupling to the distal end of the fluid conduit in order to provide an electrical continuity signal. The first static bonding circuitry unit G1 404 determines a status of an electrical continuity of an electrical loop comprising the base 442 of the loader apparatus 440 and the distal end 448 of the loading arm 444 in accordance with the fluid conduit electrical continuity signal. The use of the control and monitoring unit 420 in this example therefore differs from that described with reference to FIG. 1b in the use of the first static bonding circuitry unit G1 404, which in the example of FIG. 1b was used to determine a status of an electrical continuity of an electrical loop comprising a loader apparatus and a source tank.

The second static bonding circuitry G2 406 is arranged in a similar manner to that described with reference to FIG. 1b in that it determines a status of an electrical continuity of an electrical loop comprising the base of the loader apparatus 440 and the tank 404 on the rail car 416 and the rail track 410. The second static bonding circuitry G2 406 is connected to a track electrical connector 408 for coupling to the rail track 410, a tank electrical connector 414 for coupling to the tank 404 on a rail car 416 and a loader electrical connector 450 for coupling to the base 442 of the loader apparatus 440. The second static bonding circuitry G2 406 is configured to determine a status of an electrical continuity between the tank 404 on the rail car 416, the rail track 410 and the base 442 of the loader apparatus 440.

The fill level monitoring circuitry 402 is similar to that described previously with reference to FIG. 3. The sensor provided in the probe 448 may be either a sensor that complies with a NAMUR standard (such as EN 60947-5-6:2000 and IEC 60947-5-6:1999) or a sensor that provides an output current between 4-20 mA depending upon the fill level. The level monitoring circuit 402 may comprise circuitry configured to couple with either a NAMUR sensor or a radar sensor. In such a system, the type of sensor to be coupled to the level monitoring circuit 420 may be selected by the user as required during use. For example, the level detection sensor may be a radar or laser-type level sensor that complies with either the 4-20 mA convention or the NAMUR standard. The level detection sensor may be HAZLOC/EX certified and may operate on a two-wire principle. The output current of the sensor may be in the range 0 mA to 20 mA, depending on the fill level. A highpoint of the sensor may be set in the factory or in the field.

In the example shown, the control and monitoring unit 420 has a single user interface 424 for displaying all of the determined statuses. The user interface 424 is similar to that described with reference to FIG. 1a or 3. Each status may be represented by a pair of LEDs, where a green LED displays a safe condition and a red LED displays an error condition. An error condition may also be indicated by an audible alarm. An error condition may cause an interlock to prevent fluid flow through the fluid conduit, in some examples.

The monitoring system 420 can be used to check the electrical continuity of the loading arm with respect to the loading structure 440 before inserting the arm into the tank 404. After the loading arm 444 has been inserted into the tank 404 there may be an electrical short path from the loading arm 444 to ground via the tank 404 and so the loading arm 404 continuity may not be reliably checked.

On initiating a loading operation, a user can use the monitoring system 420 to determine a status of an electrical continuity between the distal end 448 of the loading arm 444 and the base 442 of the loader apparatus 440. The system can confirm whether the electrical continuity of the loading arm 444 with respect to the loading rack superstructure is 10 ohms or less prior to the loading arm 444 being inserted into, or engaged with, the railcar tank 404. A warning light or sound can be used as an alarm in the case that the loading arm continuity, to the loading rack superstructure, rises above 10 ohms. By performing this operation the user can be sure that all parts of the loading arm 444 are connected to the loading rack superstructure base 442, which is assumed to be permanently connected to electrical earth. Once it has been ascertained that there is electrical continuity along the loading arm 444, the user can safely engage the distal end of the loading arm with the tank and commence fluid flow. A potentially dangerous electrostatic charge build up on the loading arm 444 caused by fluid flow can therefore be prevented.

Any components that are described herein as being "coupled" or "connected" could be directly or indirectly coupled or connected. That is, one or more components could be located between two components that are said to be coupled or connected whilst still enabling the required functionality to be achieved.

Other embodiments are within the scope of the appended claims.

The invention claimed is:

1. A monitoring system for use when loading fluid from a source tank to a destination tank via a loader apparatus having a loader electrical connector coupled thereto, the monitoring system having:
    a first input having a source electrical connector for coupling to the source tank in order to receive a source tank input signal;
    a second input having a destination tank electrical connector for coupling to the destination tank in order to receive a destination tank input signal;
    a sensor input for receiving a sensor signal from a first fill level sensor in the destination tank;
    a track electrical connector for coupling to a rail track;
    circuitry configured to determine:
        whether a first status of an electrical continuity between the loader apparatus and the source tank in accordance with the source tank input signal is sufficiently low to establish grounding,
        whether a second status in accordance with a resistivity of an electrical loop comprising the loader electrical connector, the destination tank electrical connector and the track electrical connector is sufficiently low to establish grounding,
        a fill level status in accordance with the sensor signal; and
        a single user interface for displaying the first status, second status and fill level status.

2. The monitoring system of claim 1 comprising a single housing, wherein the circuitry is disposed within the single housing and the single user interface is disposed on the single housing.

3. The monitoring system of claim 1 wherein the circuitry configured to determine the first status has a first terminal and a second terminal, the circuitry configured to determine the second status has a third terminal and a fourth terminal, the first status is an alert if the resistance between the first and second terminals is greater than a predetermined threshold and wherein the second status is an alert if the resistance between the third and fourth terminals is greater than a predetermined threshold.

4. The monitoring system of claim 3 wherein the predetermined threshold is 10 ohms.

5. The monitoring system of claim 1 wherein the circuitry is configured to determine a capacitance status in accordance with a capacitance between the track electrical connector and the source tank.

6. The monitoring system of claim 1 wherein the fill level sensor is a capacitive sensor associated with the destination tank.

7. The monitoring system of claim 1 and further comprising a source sensor input for receiving a source sensor signal from a second fill level sensor in the source tank, wherein the circuitry is configured to determine a source fill level status in accordance with the source sensor signal from the second fill level sensor.

8. A monitoring system for use when loading fluid to or from a rail tanker via a loader apparatus, the monitoring system having:
    a track electrical connector for coupling to a rail track;
    a tank electrical connector for coupling to a tank on a rail car;
    a loader electrical connector for coupling to the loader apparatus; and
    circuitry configured to determine a status of electrical continuity between the tank on the rail car, the rail track and the loader.

9. The monitoring system of claim 8 comprising a single user interface for displaying the status.

10. The monitoring system of claim 9 comprising a single housing, wherein the circuitry is disposed within the single housing and the single user interface is disposed on the single housing.

11. The monitoring system of claim 8 comprising a second tank electrical connector for coupling to a second tank and wherein the circuitry is configured to determine a status of an electrical continuity between the second tank and the loader apparatus.

12. The monitoring system of claim 8 comprising a fluid conduit electrical connector for coupling to a fluid conduit and wherein the circuitry is configured to determine a status of an electrical continuity between the fluid conduit and the loader apparatus.

13. The monitoring system of claim 12 and further including a fill level sensor operatively coupled to the tank, said fill level sensor comprising a capacitive sensor.

14. The monitoring system of claim 8 comprising a sensor input for receiving a sensor signal from a fill level sensor in the tank, wherein the circuitry is configured to determine a fill level status in accordance with the sensor signal.

15. The monitoring system of claim 8, wherein the loader apparatus comprises a flow control device and the monitoring system is configured to control the flow control device in accordance with one or more of the statuses determined by the circuitry.

16. A method for monitoring the loading of fluid to or from a tank on a rail car via a loader apparatus using a monitoring system having a track electrical connector, a tank electrical connector and a loader electrical connector for coupling to the loader apparatus, the method comprising:
    coupling the track electrical connector to a rail track;
    coupling the tank electrical connector to the tank on the rail car; and
    controlling the loading operation in accordance with a status of an electrical continuity between the tank on the rail track, the loader apparatus and the rail track.

17. A loader apparatus for loading fluid to or from a tank, comprising:
    a base;

a fluid conduit mounted on the base for engaging with the tank, the fluid conduit having a proximal end and a distal end with respect to the base; and a monitoring system comprising circuitry configured to determine a status of an electrical continuity between the distal end of the fluid conduit and the base, said monitoring system comprising:

a track electrical connector for coupling to a rail track;

a tank electrical connector for coupling to a tank on a rail car;

a loader electrical connector for coupling to the loader apparatus; and circuitry configured to determine a status of an electrical continuity between the tank on the rail car, the rail track and the base of the loader apparatus.

18. The loader apparatus of claim 17 wherein the monitoring system further comprises:

a sensor input for receiving a sensor signal from a fill level sensor in a destination tank; and circuitry configured to determine a fill level status in accordance with the sensor signal.

19. The loader apparatus of claim 18 and further comprising a single user interface for displaying the determined statuses.

20. A method of monitoring the loading of fluid to or from a tank using the loader apparatus of claim 17, the method comprising:

determine a status of an electrical continuity between the proximal end and the distal end of the fluid conduit; and in accordance with the status, engaging the distal end of the fluid conduit with the tank.

* * * * *